United States Patent
Jin et al.

(10) Patent No.: US 9,105,593 B2
(45) Date of Patent: Aug. 11, 2015

(54) METHOD AND APPARATUS FOR CONTROLLING BREAKAGE BY STATIC ELECTRICITY

(75) Inventors: Guang hai Jin, Yongin (KR); Jae-Beom Choi, Yongin (KR); Kwan-Wook Jung, Yongin (KR); Moo-Jin Kim, Yongin (KR); Jae-Hwan Oh, Yongin (KR); June-Woo Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 149 days.

(21) Appl. No.: 13/554,008

(22) Filed: Jul. 20, 2012

(65) Prior Publication Data

US 2013/0200399 A1    Aug. 8, 2013

(30) Foreign Application Priority Data

Feb. 8, 2012  (KR) .................. 10-2012-0012837

(51) Int. Cl.
*G02F 1/1333* (2006.01)
*H01L 27/32* (2006.01)

(52) U.S. Cl.
CPC ................................ *H01L 27/3276* (2013.01)

(58) Field of Classification Search
CPC .......................... G02F 1/136234; G02F 1/345
USPC ............. 257/88; 247/88, 59, 72; 438/23, 155
See application file for complete search history.

(56) References Cited

U.S. PATENT DOCUMENTS

| 2005/0230757 | A1* | 10/2005 | Nagasawa et al. ............. 257/355 |
| 2005/0285984 | A1* | 12/2005 | Tsai et al. ........................ 349/40 |
| 2007/0090345 | A1* | 4/2007 | Wu et al. .......................... 257/40 |
| 2008/0174238 | A1* | 7/2008 | Jeong et al. .................... 313/504 |
| 2009/0068773 | A1* | 3/2009 | Lai et al. .......................... 438/23 |
| 2009/0179556 | A1* | 7/2009 | Kim et al. ...................... 313/504 |
| 2010/0163868 | A1* | 7/2010 | Yamazaki et al. ............... 257/43 |

FOREIGN PATENT DOCUMENTS

| KR | 10-2003-0091333 A | 12/2003 |
| KR | 10-2008-0061067 A | 7/2008 |

* cited by examiner

*Primary Examiner* — Lex Malsawma
*Assistant Examiner* — Eric Jones
(74) *Attorney, Agent, or Firm* — Lee & Morse, P.C.

(57) ABSTRACT

A display device includes a first insulation layer on a substrate, gate wires on the first insulation layer, the gate wires extending in a first direction, a second insulation layer on the gate wires, data wires on the second insulation layer, the data wires extending in a second direction crossing the first direction, pixels at intersection regions of gate wires and data wires, respectively, the pixels being connected to respective gate wires and data wires, and data leading diodes having an island form and connected to the data wires, the data leading diodes being configured to induce breakage of the first insulation layer when external static electricity passes through the data wires.

19 Claims, 8 Drawing Sheets

METHOD AND APPARATUS FOR
CONTROLLING BREAKAGE BY STATIC
ELECTRICITY

RELATED APPLICATIONS

This application claims priority to and the benefit of Korean Patent Application No. 10-2012-0012837, filed in the Korean Intellectual Property Office on Feb. 8, 2012, the entire contents of which are incorporated herein by reference.

BACKGROUND

1. Field

The described technology relates generally to a display device. More particularly, the described technology relates generally to a display device including an organic light emitting diode.

2. Description of the Related Art

A display device is a device for displaying images, and recently, a display device including an organic light emitting diode (OLED) display has come to prominence.

Unlike a liquid crystal display (LCD), the OLED display is self-emissive and does not require a light source, so the thickness and weight of an overall display device can be reduced to enhance flexible characteristics of the display device. Also, the OLED display exhibits high quality characteristics, such as low power consumption, high luminance, and a high response speed.

A conventional OLED display is provided on a substrate and includes gate wires that are extended in a predetermined direction, data wires that are extended to cross the gate wires with an insulation layer therebetween, and pixels connected to the gate wires and the data wires including OLEDs.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a display device for controlling breakage of an insulation layer by static electricity at a part where gate wires cross data wires.

An exemplary embodiment provides a display device, including a first insulation layer on a substrate, gate wires on the first insulation layer, the gate wires extending in a first direction, a second insulation layer on the gate wires, data wires on the second insulation layer, the data wires extending in a second direction crossing the first direction, pixels at intersection regions of gate wires and data wires, respectively, the pixels being connected to respective gate wires and data wires, and data leading diodes having an island form and connected to the data wires, the data leading diodes being configured to induce breakage of the first insulation layer when external static electricity passes through the data wires.

Each data leading diode may include a first leading pattern having an island form on a same layer as the gate wires, the first leading pattern being connected to a respective data wire, and a second leading pattern having an island form and facing the first leading pattern, the first insulation layer being between the first and second leading patterns.

The first leading pattern may include an overlap area overlapping the respective data wire, and a non-overlap area not overlapping the respective data wire, the second leading pattern overlapping the non-overlap area of the first leading pattern.

Each pixel may include a thin film transistor connected to a respective gate wire and data wire, and an organic light emitting diode connected to the thin film transistor.

The thin film transistor may include an active layer on a same layer as the second leading pattern, a gate electrode on a same layer as the gate wires, and a source electrode and a drain electrode on a same layer as the data wires.

The display device may further include gate leading diodes having an island form and connected to respective gate wires, the gate leading diodes being configured to induce breakage of the first insulation layer when external static electricity passes through the gate wires.

Each gate leading diode may include a third leading pattern on the gate wires and connected to the gate wires, and a fourth leading overlapping the third leading pattern, the first insulation layer being between the third and fourth leading patterns.

The third leading pattern may include an extended area extending from the gate wires, the fourth leading pattern overlapping the extended area of the third leading pattern.

The first insulation layer may be thinner than the second insulation layer.

The second insulation layer may be between the gate wires and the data wires, and a portion of the first insulation layer is inside the data leading diodes.

The second insulation layer may be between the data leading diodes and the data wires, each data leading diode being connected to a respective data line through the second insulation layer.

An exemplary embodiment also provides a display device, including a first insulation layer on a substrate, gate wires on the first insulation layer, the gate wires extending in a first direction, a second insulation layer on the gate wires, data wires on the second insulation layer, the data wires extending in a second direction crossing the first direction, pixels at intersection regions of gate wires and data wires, respectively, the pixels being connected to respective gate wires and data wires, and gate leading diodes having an island form and connected to the gate wires, the gate leading diodes being configured to induce breakage of the first insulation layer when external static electricity passes through the gate wires.

DETAILED DESCRIPTION

Example embodiments will be described more fully hereinafter with reference to the accompanying drawings. As those skilled in the art would realize, the described embodiments may be modified in various different ways, all without departing from the spirit or scope of the scope of the inventive concept. Parts that are irrelevant to the description may be omitted for clarity, and like reference numerals designate like elements throughout the specification.

In the drawings, the thickness of layers, films, panels, regions, etc., may be exaggerated for clarity. It will be understood that when an element such as a layer, film, region, or plate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

Further, the attached drawings illustrate the active matrix (AM) display device having a 2Tr-1Cap structure in which a pixel has two thin film transistors (TFTs) and one capacitor, but the present invention is not limited thereto. Therefore, the OLED display can include at least three TFTs and at least two capacitors for each pixel, and can further have an additional wire for various configurations. In this instance, the pixel represents a minimum unit for displaying an image, and the OLED display expresses the image through a plurality of pixels.

A display device according to a first exemplary embodiment will now be described with reference to FIG. 1 to FIG. 4.

Figure 1:
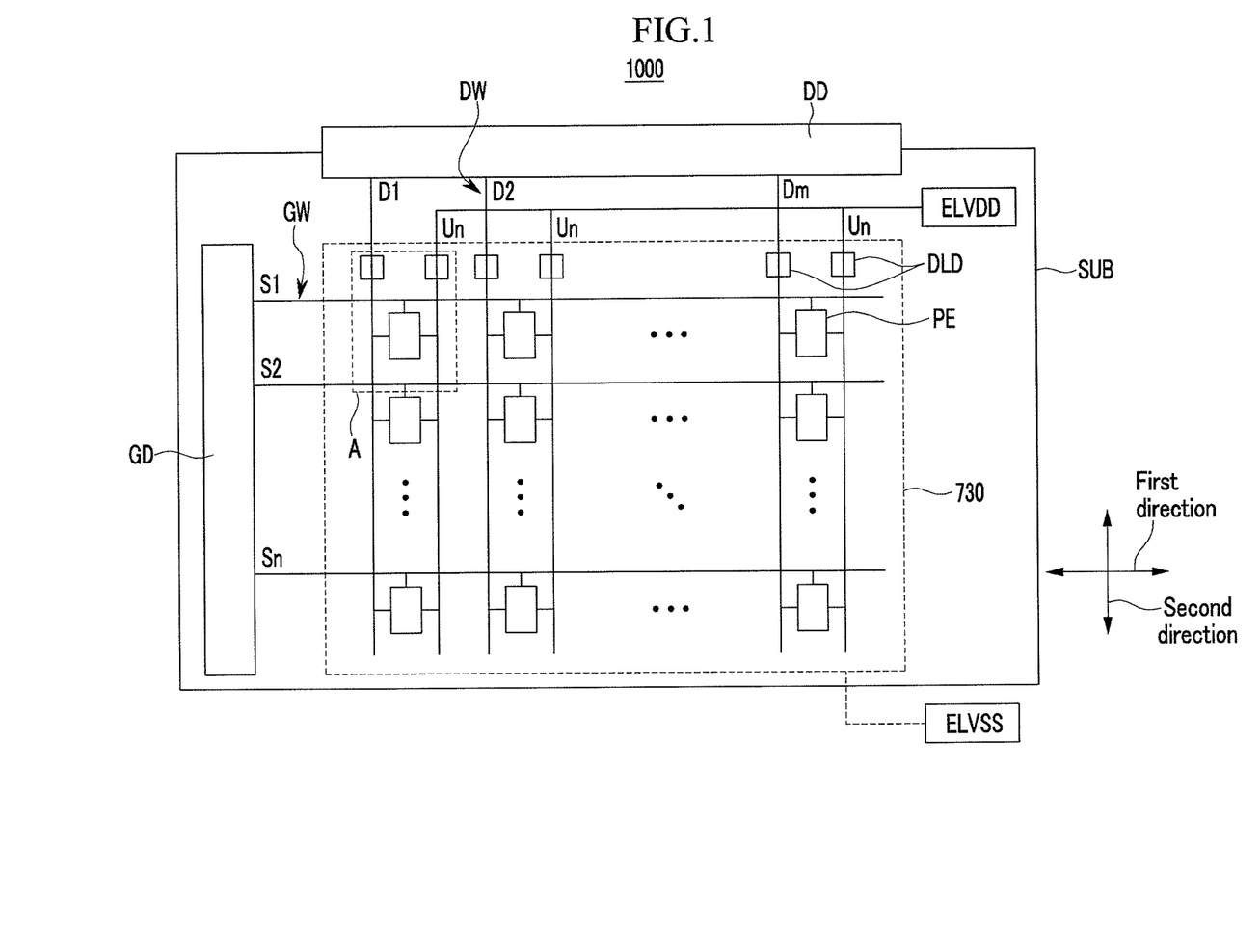
FIG. 1 shows a display device according to a first exemplary embodiment.

FIG. 1 shows a display device according to a first exemplary embodiment. As shown in FIG. 1, the display device 1000 includes a substrate (SUB), a gate driver (GD), gate wires (GW), a data driver (DD), data wires (DW), pixels (PE), and data leading diodes (DLD). Here, a pixel (PE) represents a minimum unit for displaying an image, and the display device 1000 displays an image through a plurality of pixels (PE).

The substrate (SUB) is formed as a transparent insulating substrate made of, e.g., glass, quartz, ceramic, or plastic. However, the first exemplary embodiment is not restricted thereto, and the substrate (SUB) can be formed as a metallic substrate made of, e.g., stainless steel. Further, when the substrate (SU B) is made of plastic, the display device 1000 can be flexible or rolled.

The gate driver (GD) sequentially supplies a scan signal to the gate wires (GW) corresponding to a control signal supplied by a control circuit (not shown), for example, a timing controller. The pixel (PE) is selected by the scan signal to sequentially receive a data signal.

The gate wires (GW) are provided on the substrate (SUB) with a first insulation layer (140) (FIGS. 3-4), and are extended in a first direction. The gate wires (GW) include scan lines S1-Sn that are connected to the gate driver (GD) to receive a scan signal from the gate driver (GD).

The gate wires (GW) of the display device 1000 include the scan line (Sn), and gate wires of a display device according to another exemplary embodiment can further include an additional scan line, a reset power line, and an emission control line. In this case, the display device can be an active matrix (AM) type of OLED display with the 6Tr-2Cap structure.

The data driver (DD) supplies a data signal to a data line Dm from among the data wires (DW) corresponding to a control signal supplied by the timing controller. The data signal supplied to the data line Dm is supplied to the pixel (PE) selected by the scan signal each time the scan signal is supplied to the scan line (Sn). The pixel (PE) is charged with a voltage corresponding to the data signal and emits light with corresponding luminance.

The data wires (DW) are provided on the gate wires (GW) with a second insulation layer (170) therebetween (FIGS. 3-4), and are extended in a second direction to cross the first direction. The data wires (DW) include the data lines D1-Dm and a drive power line (Un). The data line Dm is connected to the data driver (DD) and receives the data signal from the data driver (DD). The drive power line (Un) is connected to an external first power source (ELVDD), and receives drive power from the first power source (ELVDD).

The pixels (PE) are provided at points where the gate wires (GW) cross the data wires (DW), and are connected to the gate wires (GW) and the data wires (DW). Each pixel (PE) includes TFTs and a capacitor connected to the first power source (ELVDD), the gate wires (GW), and the data wires (DW), and an OLED connected between the TFTs and a second power source (ELVSS). The pixel (PE) is selected when the scan signal is supplied through the scan line (Sn), it charges the voltage corresponding to the data signal through the data line Dm, and it emits light with predetermined luminance corresponding to the charged voltage. A detailed disposal of the pixel (PE) will be described later.

The data leading diode (DLD) has an island shape, e.g., a circular or polygonal shape, and is connected to the data wires (DW). The data leading diode (DLD) induces breakage of the first insulation layer 140 when external static electricity is passed through the data wires (DW). A detailed disposal of the data leading diode (DLD) will be described later.

Figure 2:
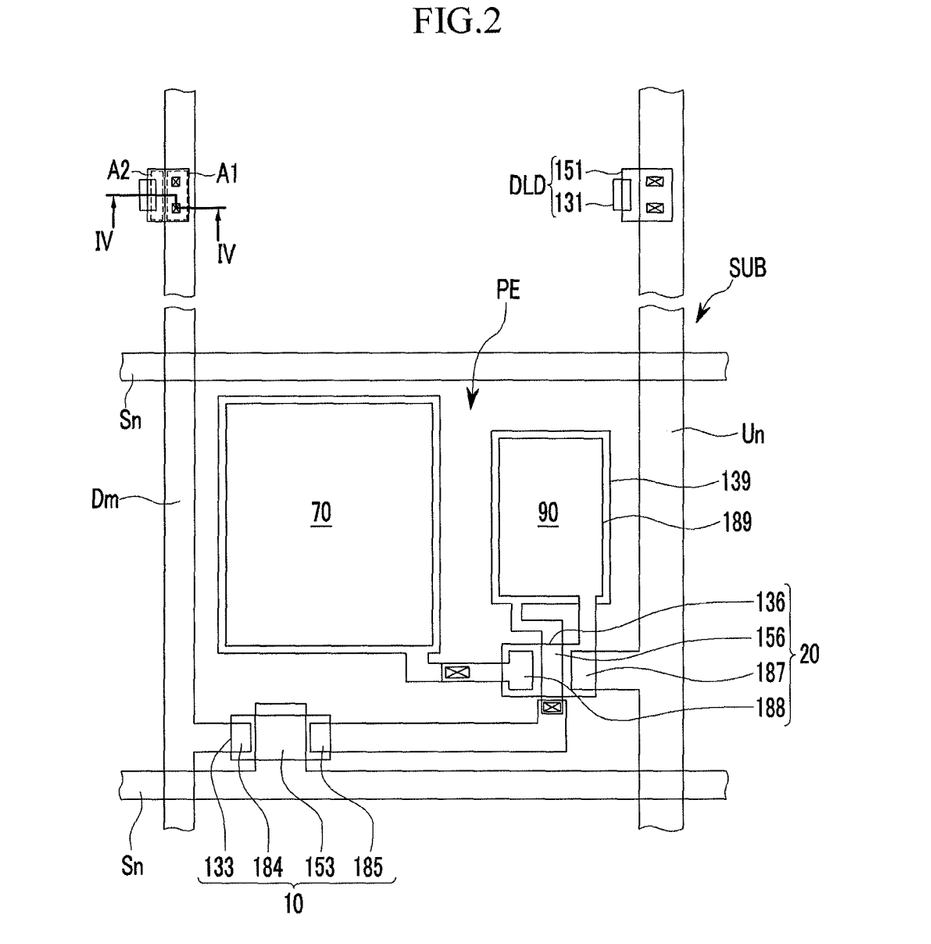
FIG. 2 shows a detailed layout of part A in FIG. 1.

The disposal of the pixel (PE) will be described with reference to FIG. 2. FIG. 2 shows a detailed layout of part A in FIG. 1.

As shown in FIG. 2, the pixel (PE) has a 2Tr-1Cap structure in which an OLED 70, two TFTs 10 and 20, and a capacitor 90 are disposed. However, in another exemplary embodiment, one pixel can have a configuration in which at least three TFTs and at least two capacitors are disposed.

The OLED 70 includes a first electrode that is an anode functioning as a hole injection electrode, a second electrode that is a cathode functioning as an electron injection electrode, and an organic emission layer disposed between the first electrode and the second electrode.

In detail, in the first exemplary embodiment, the display device includes the first TFT 10 and the second TFT 20 for each pixel (PE). The first TFT 10 and the second TFT 20 include gate electrodes 153 and 156, active layers 133 and 136, source electrodes 184 and 187, and drain electrodes 185 and 188, respectively.

The source electrode 184 of the first TFT 10 is connected to the data line (Dm), and the gate electrode 153 of the first TFT 10 is connected to the scan line (Sn). A node is formed between the source electrode 185 of the first TFT 10 and the capacitor 90, so the source electrode 185 of the first TFT 10 is connected to a first capacitor electrode 139 of the capacitor 90. Also, the source electrode 185 of the first TFT 10 is connected to the gate electrode 156 of the second TFT 20. The drive power line (Un) is connected to the source electrode 187 of the second TFT 20, and the first electrode that is the anode of the OLED 70 is connected to the drain electrode 188.

The first TFT 10 is used as a switch for selecting the pixel (PE) to emit light. When the first TFT 10 is instantly turned on, the capacitor 90 is instantly charged, and the amount of the charge is in proportion to the voltage applied from the data line (Dm). While the first TFT 10 is turned off, a gate potential of the second TFT 20 rises according to the potential charged in the capacitor 90. The second TFT 20 is turned on when the gate potential exceeds a threshold voltage. The voltage applied to the drive power line (Un) is applied to the OLED 70 through the second TFT 20, and the OLED 70 emits light.

The configuration of the above-described pixel (PE) is not restricted to the description, and is variable in many ways with a range of easy modifications by a person skilled in the art.

Figure 3:
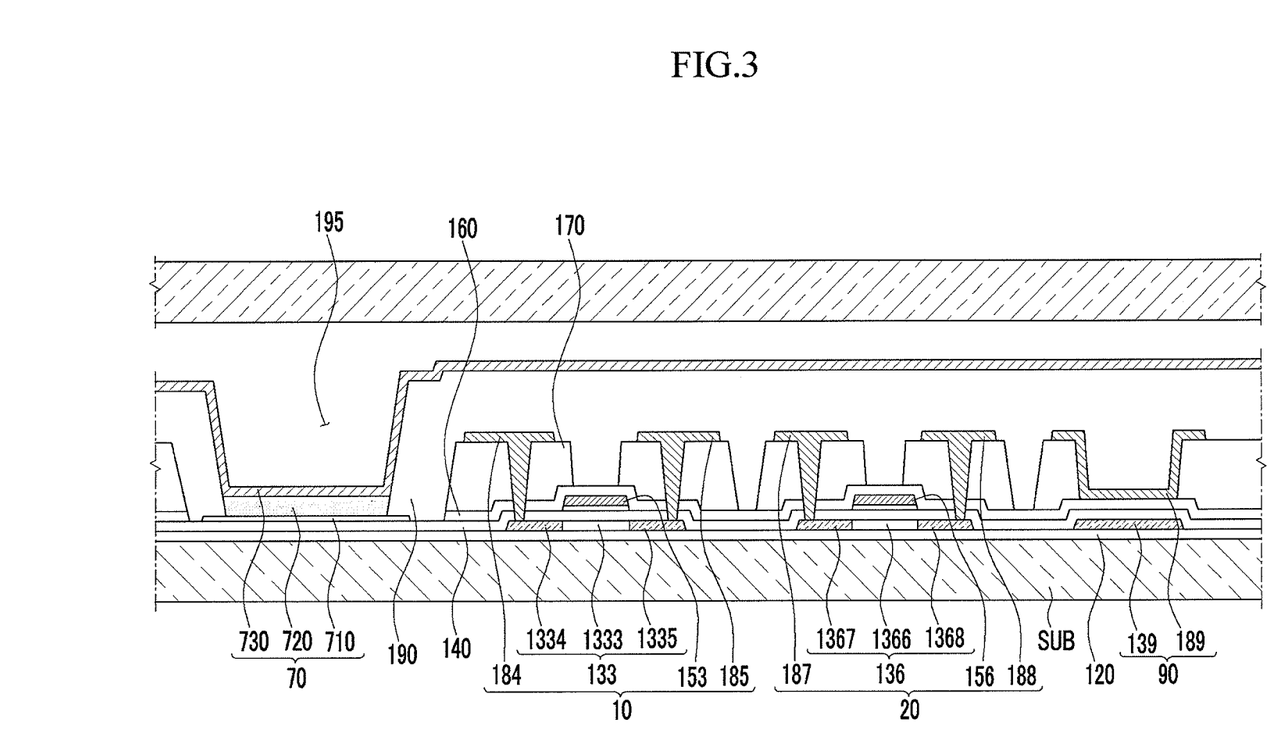
FIG. 3 shows a cross-sectional view of a thin film transistor, a capacitor, and an OLED shown in FIG. 2.

A configuration of the TFTs 10 and 20, the OLED 70, and the capacitor 90 included in the pixel (PE) of the display device 1000 according to the first exemplary embodiment will now be described in detail according to a stacked order with reference to FIG. 3. FIG. 3 shows a cross-sectional view of a TFT, a capacitor, and an OLED shown in FIG. 2.

As shown in FIG. 3, a buffer layer 120 is formed on the substrate (SUB). The buffer layer 120 is formed of a single layer or multiple layers including at least one insulating layer such as a silicon oxide layer and a silicon nitride layer by using a chemical vapor deposition method or a physical vapor deposition method. The buffer layer 120 prevents diffusion or penetration of moisture or impurities into the substrate (SUB), smoothes the surface, and controls a heat transmission speed during a crystallization process for forming an active layer. The buffer layer 120 can be omitted depending on the type of substrate (SUB) and process conditions.

The active layers 133 and 136 and the first capacitor electrode 139 are formed on the buffer layer 120. The active layers 133 and 136 and the first capacitor electrode 139 are formed by forming an amorphous silicon layer on the buffer layer 120, crystallizing the same, forming a polysilicon film, and patterning the polysilicon film. However, the first exemplary embodiment is not limited thereto. If necessary, the first capacitor electrode 139 can be formed of a material that is different from the active layers 133 and 136.

The first insulation layer 140 is formed on the active layers 133 and 136 and the first capacitor electrode 139. In detail, the first insulation layer 140 is formed to cover the active layers 133 and 136 and the first capacitor electrode 139 on the buffer layer 120. The first insulation layer 140 is formed of at least one insulating material, e.g., tetraethyl orthosilicate (TEOS), silicon nitride ($SiN_x$), and silicon oxide ($SiO_2$).

The gate electrodes 153 and 156 and a first electrode 710 of the OLED 70 are formed on, e.g., directly on, a same layer, e.g., on the first insulation layer 140. It is noted that the gate electrodes 153 and 156 and the first electrode 710 are formed on, e.g., directly on, a same layer as the scan lines (S1 to Sn). Therefore, the scan lines (S1 to Sn), i.e., the gate wires (GW), are formed on, e.g., directly on, the first insulation layer 140. The gate electrodes 153 and 156, the first electrode 710, and the gate wires (GW) are formed of the same material.

The gate electrodes 153 and 156 are formed on the active layers 133 and 136, so that they may be overlap channel regions 1333 and 1366 of the active layers 133 and 136, respectively. The active layers 133 and 136 include the channel regions 1333 and 1366 to which no impurity is doped, and source regions 1334 and 1367 and drain regions 1335 and 1368 that are disposed on respective sides of the channel regions 1333 and 1366 and to which an impurity is doped. The gate electrodes 153 and 156 may prevent the impurity from being doped into the channel regions 1333 and 1366 while the impurity is doped into the source regions 1334 and 1367 and into the drain regions 1335 and 1368. Also, the impurity can be doped into the first capacitor electrode 139 while the impurity is doped into the source regions 1333 and 1366 and into the drain regions 1335 and 1368 of the active layers 133 and 136, respectively.

Further, the gate electrodes 153 and 156 are formed of double layers including a gate transparent layer and a gate metal layer that is formed on the gate transparent layer. For example, the gate metal layer is formed inclusive of at least one metallic material, e.g., molybdenum (Mo), chromium (Cr), aluminum (Al), silver (Ag), titanium (Ti), tantalum (Ta), and/or tungsten (W). For example, the gate transparent layer includes at least one of transparent conductive layer, e.g., indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO). For example, the first electrode 710 of the OLED 70 is formed on a same layer and of a same material as the gate transparent layers of the gate electrodes 153 and 156.

An inorganic insulation layer 160 is formed on the gate electrodes 153 and 156. The inorganic insulation layer 160 includes at least one of a silicon oxide layer and a silicon nitride layer. That is, the inorganic insulation layer 160 can be formed of a single layer made of silicon oxide or silicon nitride, or multiple layers stacked with the silicon oxide layer and the silicon nitride layer. Also, the inorganic insulation layer 160 can include hydrogen. Particularly, the silicon nitride layer can easily include hydrogen according to the process conditions. The inorganic insulation layer 160 can support an annealing process by supplying hydrogen to the active layers 133 and 136 while the active layers 133 and 136 undergo the annealing process, in addition to the insulation function.

However, the first exemplary embodiment is not limited thereto. Therefore, the inorganic insulation layer 160 can be omitted. That is, the second insulation layer 170 to be described can be formed on the gate electrodes 153 and 156.

Also, the inorganic insulation layer 160 is not formed on the first electrode 710. That is, the inorganic insulation layer 160 is formed to expose the first electrode 710.

A second insulation layer 170 is formed on the inorganic insulation layer 160. The second insulation layer 170 can be easily formed to be relatively thicker than the inorganic insulation layer 160. Therefore, the second insulation layer 170 can be formed to be thick enough to acquire stable interlayer insulation. For example, the second insulation layer 170 can be formed to be about 3 μm thick.

The second insulation layer 170 is thicker than the first insulation layer 140, so the first insulation layer 140 is thinner than the second insulation layer 170.

Further, the second insulation layer 170 is not formed on the first electrode 710 in a like manner of the inorganic insulation layer 160. That is, the second insulation layer 170 is formed to expose the first electrode 710.

A plurality of conductive wires, e.g., conductive wires 184, 185, 187, 188, and 189, are formed on a same layer as the data lines (D1 to Dm), i.e., the data wires (DW), and are formed of the same material. The conductive wires, i.e., the source electrodes 184 and 187, drain electrodes 185 and 188, and second capacitor electrode 189, are formed of a same material as the data wires (DW) and on, e.g., directly on, a same layer, e.g., directly on the second insulation layer 170, as the data wires (DW). The conductive wires may further include a data line Dm and a drive power line (Un). Further, the conductive wires 184, 185, 187, 188, and 189 can be formed by including at least one metallic material in a like manner of the gate electrodes 153 and 156.

The source electrodes 184 and 187 and the drain electrodes 185 and 188 contact the source regions 1334 and 1367 and the drain regions 1335 and 1368 of the active layers 133 and 136 through contact holes that are formed in the inorganic insulation layer 160 and the second insulation layer 170.

Also, the second capacitor electrode 189 is formed at the same position as the source electrodes 184 and 187 and the drain electrodes 185 and 188, but the first exemplary embodiment is not limited thereto. Therefore, the second capacitor electrode 189 can be formed on the same layer as the gate electrodes 153 and 156.

A pixel defining layer 190 is formed on the conductive wires 184, 185, 187, 188, and 189. That is, the pixel defining layer 190 is provided on the data lines (D1 to Dm). The pixel defining layer 190 includes a pixel opening 195 for revealing a part of the first electrode 710. The pixel defining layer 190 can be formed of any suitable organic material. For example, the pixel defining layer 190 is patterned to be a photosensitive organic layer, and is formed after being cured by heat or light.

An organic emission layer 720 is formed on the first electrode 710, and a second electrode 730 is formed on the organic emission layer 720. The first electrode 710, the organic emission layer 720, and the second electrode 730 form the OLED 70. The pixel opening 195 of the second insulation layer 190 on which the first electrode 710, the organic emission layer 720, and the second electrode 730 are sequentially stacked becomes a light emitting region of the OLED 70.

Figure 4:
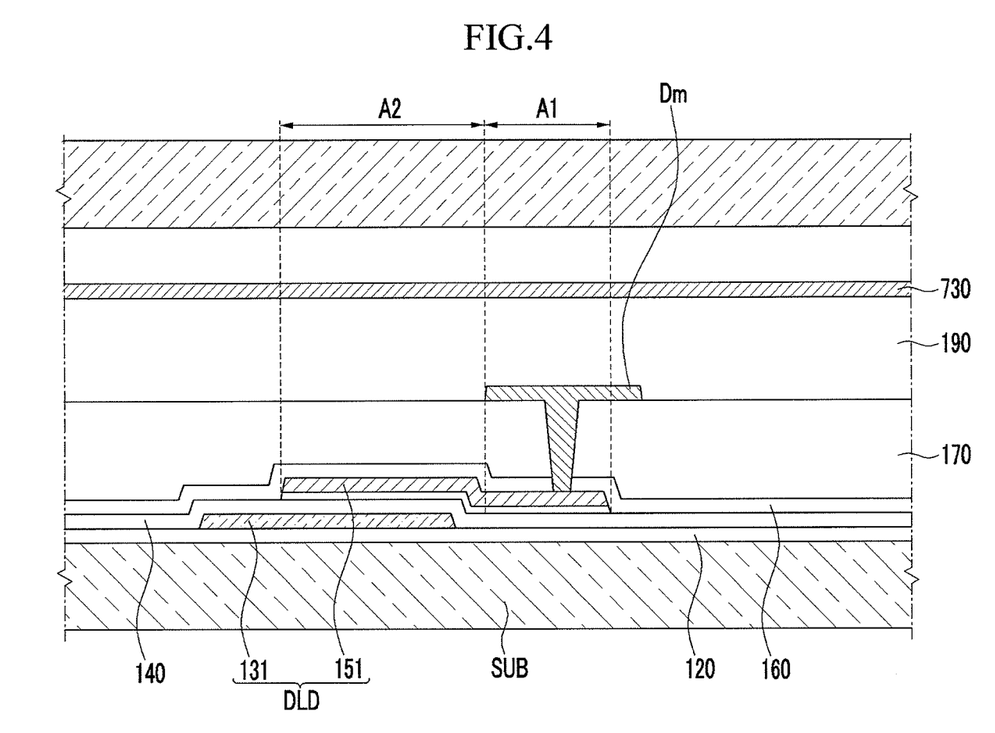
FIG. 4 shows a cross-sectional view along line VI-VI of FIG. 2.

A disposal of the data leading diode (DLD) will now be described with reference to FIG. 2 and FIG. 4. FIG. 4 shows a cross-sectional view along line IV-IV of FIG. 2.

As shown in FIG. 2 and FIG. 4, the data leading diode (DLD) is connected in an island form to the data wires (DW). In detail, the data leading diode (DLD) is connected to the data line Dm, the data wires (DW), and the drive power line (Un).

The data leading diode (DLD) includes a first leading pattern 151 and a second leading pattern 131.

The first leading pattern 151 is provided in an island form on the same layer as the gate wires (GW), and is connected to the data line Dm, the data wires (DW), and the drive power line (Un). The first leading pattern 151 includes an overlap area A1 overlapping the data wires (DW) and a non-overlap area A2 not overlapping the data wires (DW). For example, the overlap and non-overlap areas A1 and A2 are integral and contiguous with each other. As shown in FIG. 2, the first leading pattern 151 is moved in a predetermined direction compared to the data wires (DW). For example, the first leading pattern 151 is shifted, e.g., along the first direction, to be offset with respect to the data wires (DW), so only a portion of the first leading pattern 151, e.g., overlap area A1, overlaps a respective data wire (DW). The first leading pattern 151 is formed on the same layer as the scan lines (S1 to Sn) and the gate wires (GW) and of the same material. The first leading pattern 151 is formed, e.g., simultaneously, with the gate wires (GW) by a process for forming the gate wires (GW).

The second leading pattern 131 in an island form faces the first leading pattern 151 with the first insulation layer 140 therebetween. The second leading pattern 131 faces the non-overlap area A2 of the first leading pattern 151, and is overlapped by the non-overlap area A2 of the first leading pattern 151. For example, the second leading pattern 131 may overlap only the non-overlap area A2 of the first leading pattern 151, so the second leading pattern 131 may not overlap the data wire (DW). Therefore, the overlap and non-overlap areas A1 and A2 of the first leading pattern 151 may be at different heights relative to the substrate (SUB). The second leading pattern 131 is formed on the same layer as the active layers 133 and 136 and of the same material. The second leading pattern 131 is formed, e.g., simultaneously, with the active layers 133 and 136 by a process for forming the active layers 133 and 136 and the first capacitor electrode 139. Also, the second leading pattern 131 can be doped with an impurity when the impurity is doped into the source regions 1333 and 1366 and the drain region of the active layers 133 and 136. For example, the first leading pattern 151 is between the second leading pattern 131 and the data wire (DW).

As described above, regarding the display device 1000, the data leading diode (DLD) including the first leading pattern 151 and the second leading pattern 131 is connected to the data wires (DW), so when static electricity passes through the data wires (DW), the first insulation layer 140 provided between the first leading pattern 151 and the second leading pattern 131 breaks, rather than the second insulation layer 170 at intersections between the gate wires (GW) and the data wires (DW). Therefore, short-circuits of the gate wires (GW) and the data wires (DW) may be prevented or substantially minimized.

In contrast, a conventional OLED display, e.g., a display without data leading diodes connected to the data wires, may include an insulation layer between the gate wires and the data wires, and a capacitor on the insulation layer, where the gate and data wires intersect. Therefore, when external static electricity passes through the gate wires or the data wires, the insulation layer, on which the capacitor is formed, may break, thereby causing a short circuit between the gate wires and the data wires.

It is noted that the display device 1000 according to the first embodiment is an OLED display including an OLED. However, example embodiments are not limited thereto, e.g., the display device may be a LCD device in which the gate wires cross the data wires, a plasma display panel (PDP), or an electrophoretic display (EPD).

It is further noted that the data leading diode (DLD) of the display device 1000 according to the first exemplary embodiment is adjacent an outermost pixel (PE). However, example embodiments are not limited thereto, e.g., the data leading diode of the display device may be between adjacent pixels.

A display device according to a second exemplary embodiment will now be described with reference to FIG. 5 to FIG. 7. It is noted that only parts that are different from the first exemplary embodiment will be described, while parts equivalent to those of the first exemplary embodiment will be omitted.

Figure 5:
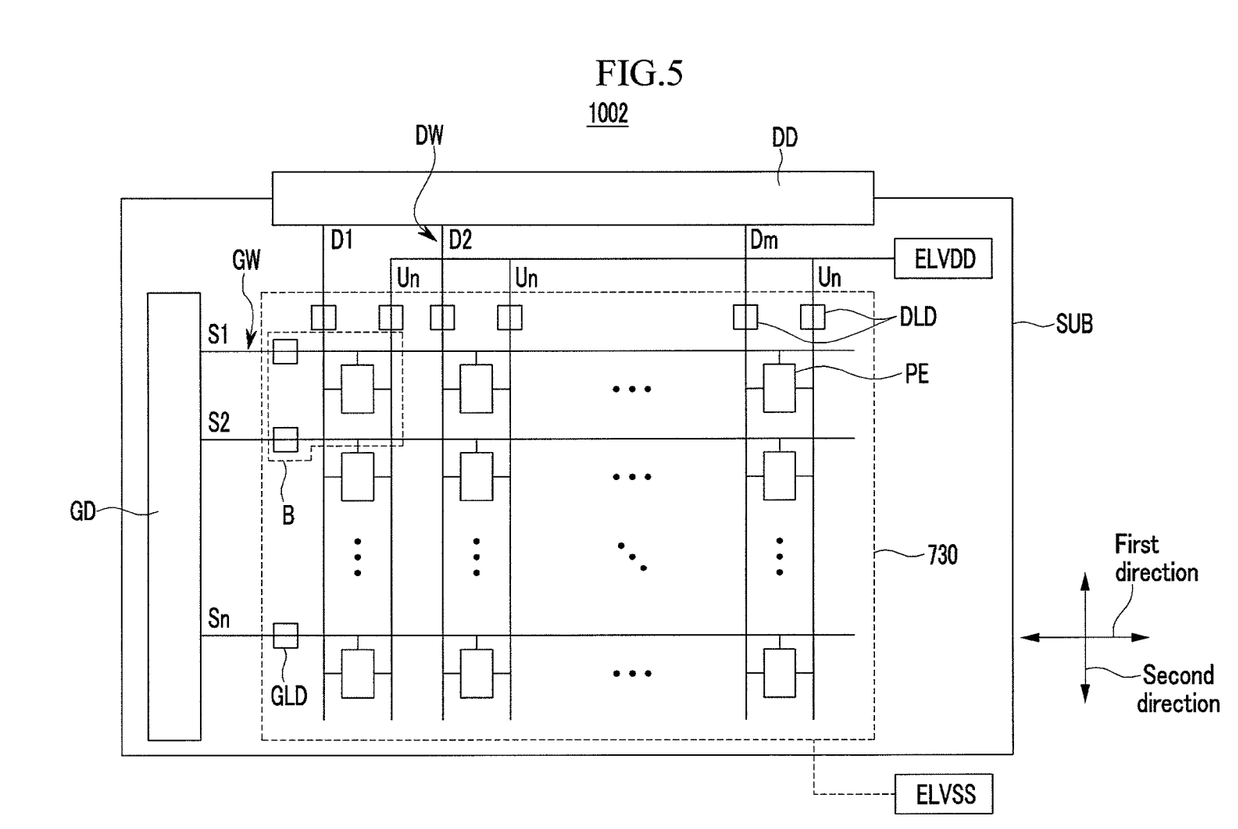
FIG. 5 shows a display device according to a second exemplary embodiment.

FIG. 5 shows a display device according to a second exemplary embodiment. As shown in FIG. 5, a display device 1002 includes the substrate (SUB), the gate driver (GD), the gate wires (GW), the data driver (DD), the data wires (DW), the pixels (PE), the data leading diodes (DLD), and gate leading diodes (GLD). The gate leading diodes (GLD) are connected in island form to respective gate wires (GW), and they induce breakage of the first insulation layer 140 when external static electricity passes through the gate wires (GW).

Figure 6:
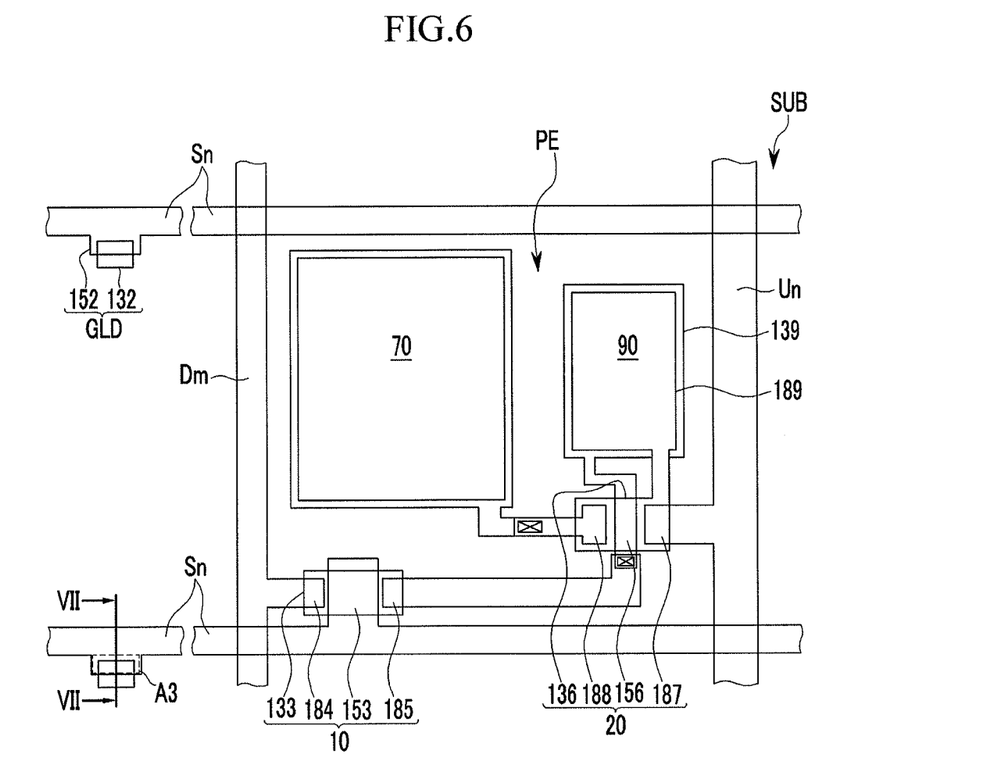
FIG. 6 shows a detailed layout of part B in FIG. 5.

FIG. 6 shows a detailed layout view of part B in FIG. 5. FIG. 7 shows a cross-sectional view along line VII-VII of FIG. 6.

Figure 7:
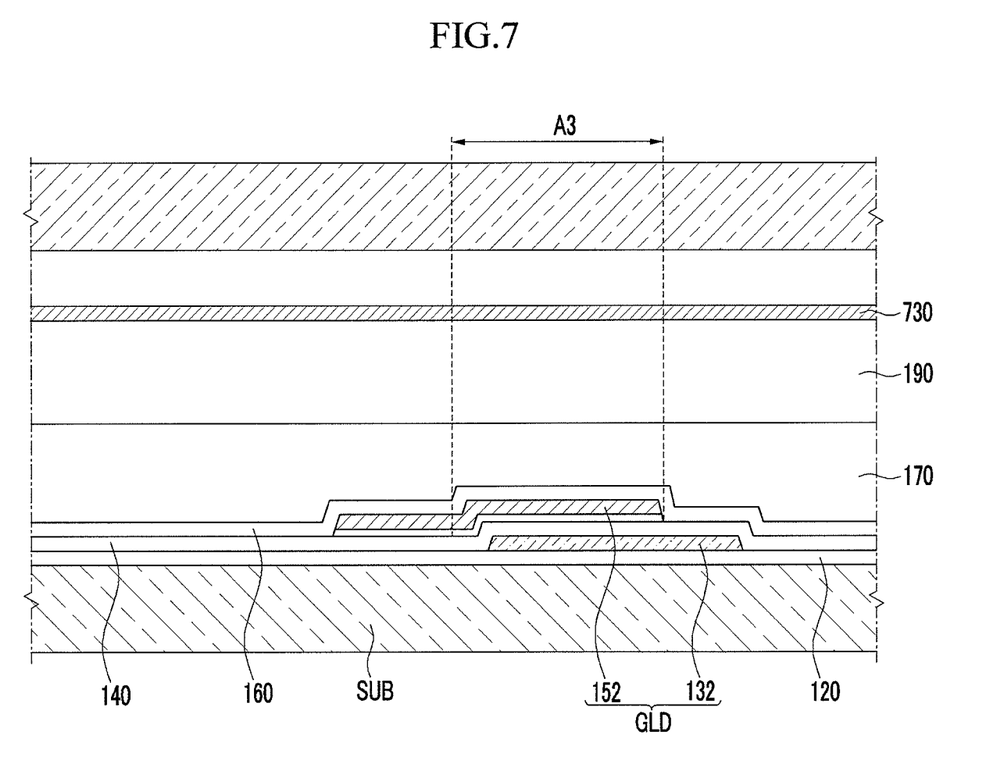
FIG. 7 shows a cross-sectional view along line VII-VII of FIG. 6.

As shown in FIG. 6 and FIG. 7, the gate leading diode (GLD) includes a third leading pattern 152 and a fourth leading pattern 132. The third leading pattern 152 is extended from a respective gate wire (GW), and it is provided on the same layer as the gate wire (GW) and is connected to the scan line (Sn) and the gate wire (GW). The third leading pattern 152 includes an extended area A3 extending from the scan line (Sn) and the gate wire (GW). That is, as shown in FIG. 6, the third leading pattern 152 is extended in a predetermined direction compared to the scan line (Sn) and the gate wire (GW). The third leading pattern 152 is formed on a same layer as the scan lines (S1 to Sn) and the gate wires (GW), and of the same material. The third leading pattern 152 is formed, e.g., simultaneously, with the gate wires (GW) by a process for forming the gate wires (GW).

The fourth leading pattern 132 in an island form faces the third leading pattern 152 with the first insulation layer 140 therebetween. The fourth leading pattern 132 faces the extended area A3 of the third leading pattern 152, and it overlaps the extended area A3 of the third leading pattern 152. The fourth leading pattern 132 is formed on the same layer as the active layers 133 and 136, and of the same material. The fourth leading pattern 132 is formed, e.g., simultaneously, with the active layers 133 and 136 by a process for forming the active layers 133 and 136 and the first capacitor electrode 139. Further, an impurity can be doped to the fourth leading pattern 132 while the impurity is doped to the source regions 1333 and 1366 and the drain region of the active layers 133 and 136.

As described, regarding the display device 1002, the data leading diode (DLD) including the first leading pattern 151 and the second leading pattern 131 is connected to the data wires (DW) and the gate leading diode (GLD) including the third leading pattern 152 and the fourth leading pattern 132 is connected to the gate wires (GW). Therefore, when external static electricity passes through the gate wires (GW) or the data wires (DW), the first insulation layer 140 provided between the first leading pattern 151 and the second leading pattern 131, or between the third leading pattern 152 and the fourth leading pattern 132, is broken, rather than the second insulation layer 170 provided on the parts where the gate wires (GW) cross the data wires (DW). Accordingly, a potential breakage of an insulation layer provided on the part where the gate wires cross the data wires, which in turn may short-circuit the gate wires (GW) and the data wires (DW), may be prevented or substantially minimized.

Also, the gate leading diode (GLD) of the display device 1002 according to the second embodiment is adjacent the outermost pixel (PE). However, the gate leading diode (GLD) may be provided, e.g., between adjacent pixels.

A display device according to a third exemplary embodiment will now be described with reference to FIG. 8. It is noted that only parts that are different from the first exemplary embodiment will be described, while parts equivalent to those of the first exemplary embodiment will be omitted.

Figure 8:
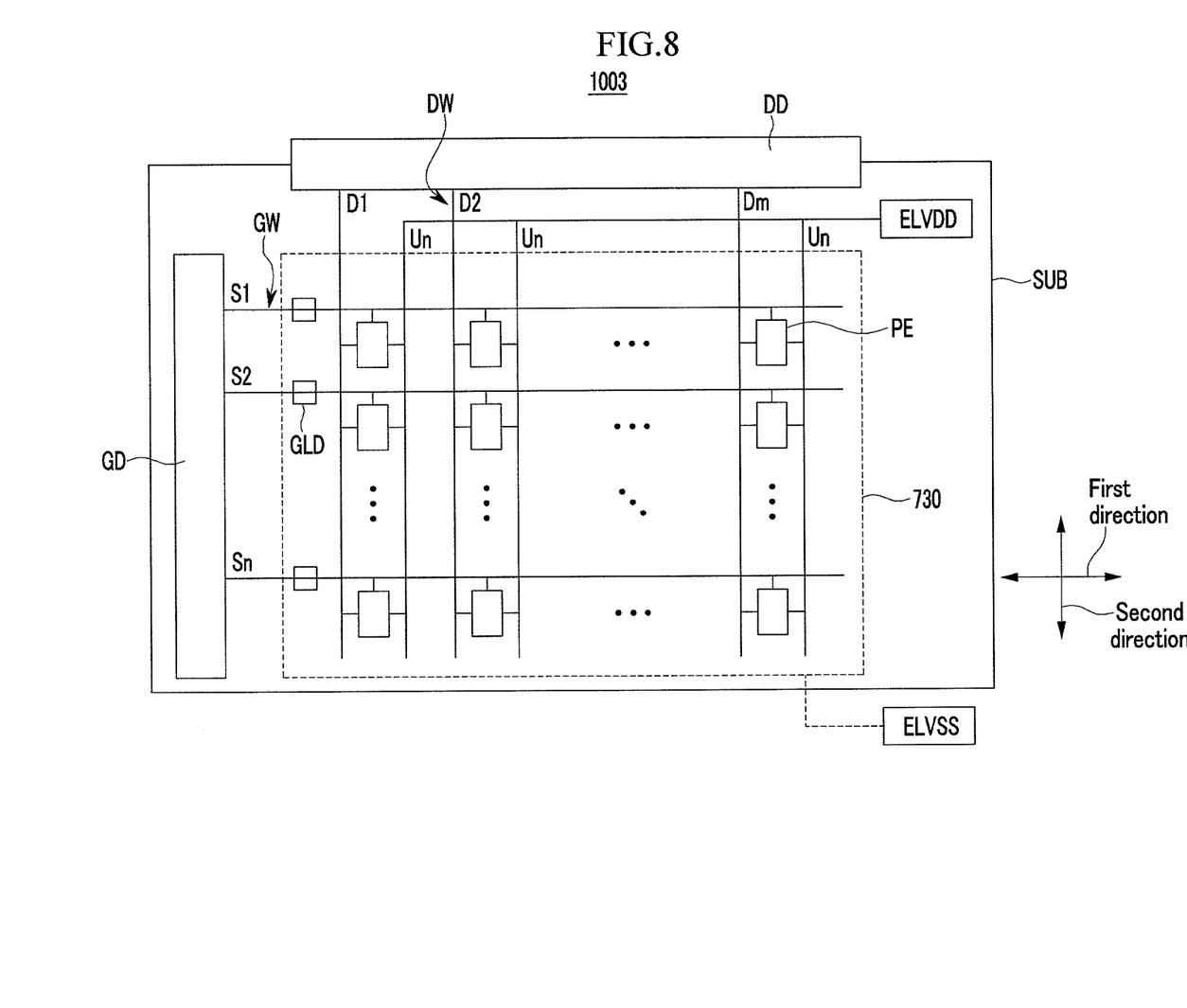
FIG. 8 shows a display device according to a third exemplary embodiment.

FIG. 8 shows a display device according to a third exemplary embodiment. As shown in FIG. 8, the display device 1003 includes the substrate (SUB), the gate driver (GD), the gate wires (GW), the data driver (DD), the data wires (DW), the pixels (PE), and the gate leading diodes (GLD). The gate leading diodes (GLD) are connected in an island form to the gate wires (GW), and they induce breakage of the first insulation layer 140, when external static electricity passes through the gate wires (GW). For example, the display device 1003 may include only the gate leading diodes (GLD) without the data leading diode (DLD).

As described, regarding the display device 1003 according to the third exemplary embodiment, the gate leading diode (GLD) is connected to the gate wires (GW), so when external static electricity passes through the gate wires (GW), the first insulation layer 140 corresponding to the gate leading diode (GLD) is broken, rather than the second insulation layer 170 provided on parts where the gate wires (GW) cross the data wires (DW). As such, the problem, in which an insulation layer provided on the parts where the gate wires (GW) cross the data wires (DW) is broken and the gate wires (GW) and the data wires (DW) are short-circuited, may be controlled.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a first insulation layer on a substrate;
   gate wires on the first insulation layer, the gate wires extending in a first direction;
   a second insulation layer on the gate wires;
   data wires on the second insulation layer, the data wires extending in a second direction crossing the first direction;
   pixels at intersection regions of gate wires and data wires, respectively, the pixels being connected to respective gate wires and data wires; and
   data leading diodes, each including a first leading pattern and a second leading pattern, the first leading pattern on a portion of the second leading pattern, the first leading pattern being connected to a respective one of the data wires, the data leading diodes being configured to induce breakage of the first insulation layer when external static electricity passes through the data wires, wherein:
   the first leading pattern at least partially overlaps the respective one of the data wires in a first direction,
   the second leading pattern at least partially overlaps the first leading pattern in the first direction, and
   the first direction corresponds to an axis which passes through the respective one of the data wires, the first leading pattern, and the first insulation layer.

2. The display device of claim 1, wherein
   the first leading pattern has an island form on a same layer as the gate wires; and
   the second leading pattern having an island form and facing the first leading pattern, the first insulation layer being between the first leading pattern and the second leading pattern.

3. The display device of claim 2, wherein the first leading pattern includes:
   an overlap area overlapping the respective one of the data wires; and
   a non-overlap area not overlapping the respective one of the data wires, the second leading pattern on the non-overlap area of the first leading pattern.

4. The display device of claim 2, wherein each pixel includes a thin film transistor connected to the respective gate wire and data wire, and an organic light emitting diode connected to the thin film transistor.

5. The display device of claim 4, wherein the thin film transistor includes:
   an active layer on a same layer as the second leading pattern;
   a gate electrode on a same layer as the gate wires; and
   a source electrode and a drain electrode on a same layer as the data wires.

6. The display device of claim 4, the second insulation layer is formed to expose an electrode of the organic light emitting diode.

7. The display device of claim 1, further comprising:
   gate leading diodes connected to respective gate wires, the gate leading diodes being configured to induce breakage of the first insulation layer when external static electricity passes through the gate wires.

8. The display device of claim 7, wherein each gate leading diode includes:
   a third leading pattern on the gate wires and connected to the gate wires; and a fourth leading pattern overlapping the third leading pattern, the first insulation layer being between the third and fourth leading patterns.

9. The display device of claim 8, wherein the third leading pattern includes an extended area extending from the gate wires, the fourth leading pattern overlapping the extended area of the third leading pattern.

10. The display device of claim 1, wherein the first insulation layer is thinner than the second insulation layer.

11. The display device of claim 1, wherein
the second insulation layer is between the gate wires and the data wires, and
a portion of the first insulation layer is inside the data leading diodes.

12. The display device of claim 1, wherein the second insulation layer is between at least one of the data leading diodes and the respective one of the data wires, each data leading diode being connected to a respective one of the data wires through the second insulation layer.

13. The display device of claim 1, wherein the second leading pattern does not overlap the data wires.

14. A display device, comprising:
a first insulation layer on a substrate;
gate wires on the first insulation layer, the gate wires extending in a first direction;
a second insulation layer on the gate wires;
data wires on the second insulation layer, the data wires extending in a second direction crossing the first direction;
pixels at intersection regions of gate wires and data wires, respectively, the pixels being connected to the respective gate wires and data wires; and
gate leading diodes, each including a first leading pattern and a second leading pattern, the first leading pattern on a portion of the second leading pattern, the first leading pattern being connected to a respective one of the gate wires, the gate leading diodes being configured to induce breakage of the first insulation layer when external static electricity passes through the gate wires, wherein:
the first leading pattern at least partially overlaps the respective one of the data wires in a first direction,
the second leading pattern at least partially overlaps the first leading pattern in the first direction, and
the first direction corresponds to an axis which passes through the respective one of the data wires, the first leading pattern, the first insulation layer, and the substrate.

15. A display device, comprising:
a first insulation layer on a substrate;
first wires on the first insulation layer, the first wires extending in a first direction;
a second insulation layer on the first wires;
second wires on the second insulation layer, the second wires extending in a second direction crossing the first direction;
pixels at intersection regions of the first wires and the second wires, respectively, the pixels being connected to the respective first wires and the second wires; and
leading diodes, each including a first leading pattern and a second leading pattern, the first leading pattern on a portion of the second leading pattern, the first leading pattern being connected to a respective one of the first wires or a respective one of the second wires, each of the leading diodes being configured to induce breakage of the first insulation layer when external static electricity passes through the respective one of the first wires or the respective one of the second wires, wherein:
the first leading pattern at least partially overlaps the respective one of the first wires or the respective one of the second wires in a first direction,
the second leading pattern at least partially overlaps the first leading pattern in the first direction, and
the first direction corresponds to an axis which passes through the respective one of the first wires or the respective one of the second wires, the first leading pattern, the first insulation layer, and the substrate.

16. The display device of claim 15, wherein
the first leading pattern has an island form on a same layer as the first wires, the first leading pattern being connected to the respective one of the second wires; and
the second leading pattern having an island form and facing the first leading pattern, the first insulation layer being between the first leading pattern and the second leading pattern.

17. The display device of claim 16, wherein the first leading pattern includes:
an overlap area on the respective one of the first wires; and
a non-overlap area not on the respective one of the second wires, the second leading pattern on the non-overlap area of the first leading pattern.

18. The display device of claim 16, wherein the first insulation layer is thinner than the second insulation layer.

19. The display device of claim 15, wherein the second leading pattern does not overlap the first wires.

* * * * *